United States Patent [19]
Hashinaga

[11] Patent Number: 5,245,276
[45] Date of Patent: Sep. 14, 1993

[54] SEMICONDUCTOR DEVICE STORAGE JIG

[75] Inventor: Tatsuya Hashinaga, Yokohama, Japan

[73] Assignee: Sumitomo Electric Industries, Ltd., Osaka, Japan

[21] Appl. No.: 657,858

[22] Filed: Feb. 20, 1991

[30] Foreign Application Priority Data

Feb. 20, 1990 [JP] Japan ............... 2-39284

[51] Int. Cl.⁵ ........................... G01R 31/00
[52] U.S. Cl. ................. 324/158 F; 324/158 R
[58] Field of Search ........... 361/212, 213, 215, 220; 439/5, 68, 70, 86; 324/158 F, 158 P, 158 R

[56] References Cited

U.S. PATENT DOCUMENTS

| | | | |
|---|---|---|---|
| 3,976,916 | 8/1976 | Saurenman | 361/213 |
| 4,327,832 | 5/1982 | de Matteo | 361/380 |
| 4,472,756 | 9/1984 | Masuda | 361/220 |
| 4,484,243 | 11/1984 | Herbst et al. | 361/104 |
| 4,617,605 | 10/1986 | Obrecht et al. | 361/220 |
| 4,623,951 | 11/1986 | Du Pont et al. | 361/220 |
| 4,677,520 | 6/1987 | Price | 361/220 |
| 4,711,350 | 12/1987 | Yen | 361/220 |
| 4,806,111 | 2/1989 | Nishi | 439/109 |
| 4,954,878 | 9/1990 | Fox et al. | 439/68 |
| 4,999,023 | 3/1991 | Froloff | 439/86 |

FOREIGN PATENT DOCUMENTS

| | | |
|---|---|---|
| 2214491 | 9/1989 | Fed. Rep. of Germany . |
| 3810594 | 10/1989 | Fed. Rep. of Germany . |
| 1568750 | 6/1980 | United Kingdom .......... 439/5 |

OTHER PUBLICATIONS

"Solderless Electrical Contacts", by Miller et al., IBM Tech. Disc. Bull., vol. 7, #1, Jun. 1964.
"Shock and Electrostatic Discharge Protective Linear Device Bank", by IBM, Tech. Disc. Bull., vol. 28, #7, Dec. 7, 1985, pp. 2953-2954.

*Primary Examiner*—Vinh Nguyen
*Attorney, Agent, or Firm*—Cushman, Darby & Cushman

[57] ABSTRACT

A semiconductor device storage jig has a vessel which is made of material having a first melting point. The vessel has a recess filled with a conductive material, which is made of a metal having a second melting point lower than the first melting point. The conductive material is in a liquid state, and a member is electrically connected to the conductive material for grounding the conductive material.

15 Claims, 5 Drawing Sheets

SEMICONDUCTOR DEVICE STORAGE JIG

BACKGROUND OF THE INVENTION

1. Field of the Invention

The present invention relates to a jig and a jig structure for storing a semiconductor device.

2. Related Background Art

A semiconductor circuit element (to be referred to as an IC chip hereinafter) has low heat resistance but is expected to be used in an any temperature atmosphere. For this reason, it is very important for the IC chip to have high reliability at high temperatures. High-temperature storage and high-temperature tests are required for IC chips.

In high-temperature storage and high-temperature tests of IC chips, external terminals of an IC chip are placed in direct contact with a metal plate, or the external terminals of the IC chip are kept in a floating state by using a plastic magazine jig. When each external terminal of the IC chip is to be grounded, it can be achieved by using an IC socket.

An IC chip is susceptible to static electricity. Since static electricity has a high voltage, if an electrostatic voltage is applied to the IC chip even for a very short interval, elements in the IC chip are damaged. In order to prevent this, the external terminals of the IC chip are grounded to discharge the electrostatic voltage to the outside of the chip. The most effective jig for grounding all the external terminals of the IC chip is the IC socket, as described above. The IC socket, however, cannot be used at a temperature exceeding the melting point (about 308° C.) of its material, thus posing a problem. As a result, the high-temperature storage or high-temperature test cannot be performed while the external terminals are kept grounded.

SUMMARY OF THE INVENTION

It is an object of the present invention to solve the above problem and to provide a semiconductor device storage jig capable of storing a semiconductor device in a grounded state even at a high temperature.

There is provided a jig for storing a semiconductor device having external terminals at a predetermined temperature, comprising a vessel which has a recess for receiving the external terminals and which has a melting point higher than at least the predetermined temperature, a conductive member which is made of a material having a melting point lower than the melting point of the vessel and which is filled in the recess, and means, electrically connected to the conductive member, for grounding the conductive member.

In the semiconductor device storage jig according to the present invention, the conductive member having a melting point lower than that of the vessel is filled in the recess of the vessel. When the ambient temperature greater than or equal to the melting point of the conductive member and is less than the melting point of the vessel, only the conductive member is melted in the vessel. When the IC chip is inserted into the vessel, the external terminals of the IC chip are dipped in the molten conductive member. When the molten conductive member is grounded, all the external terminals are kept grounded. For this reason, the IC chip can be stored at a temperature which allows a molten state of the conductive material and which is less than or equal to the melting point of the vessel, while all the external terminals of the IC chip are kept grounded.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1:
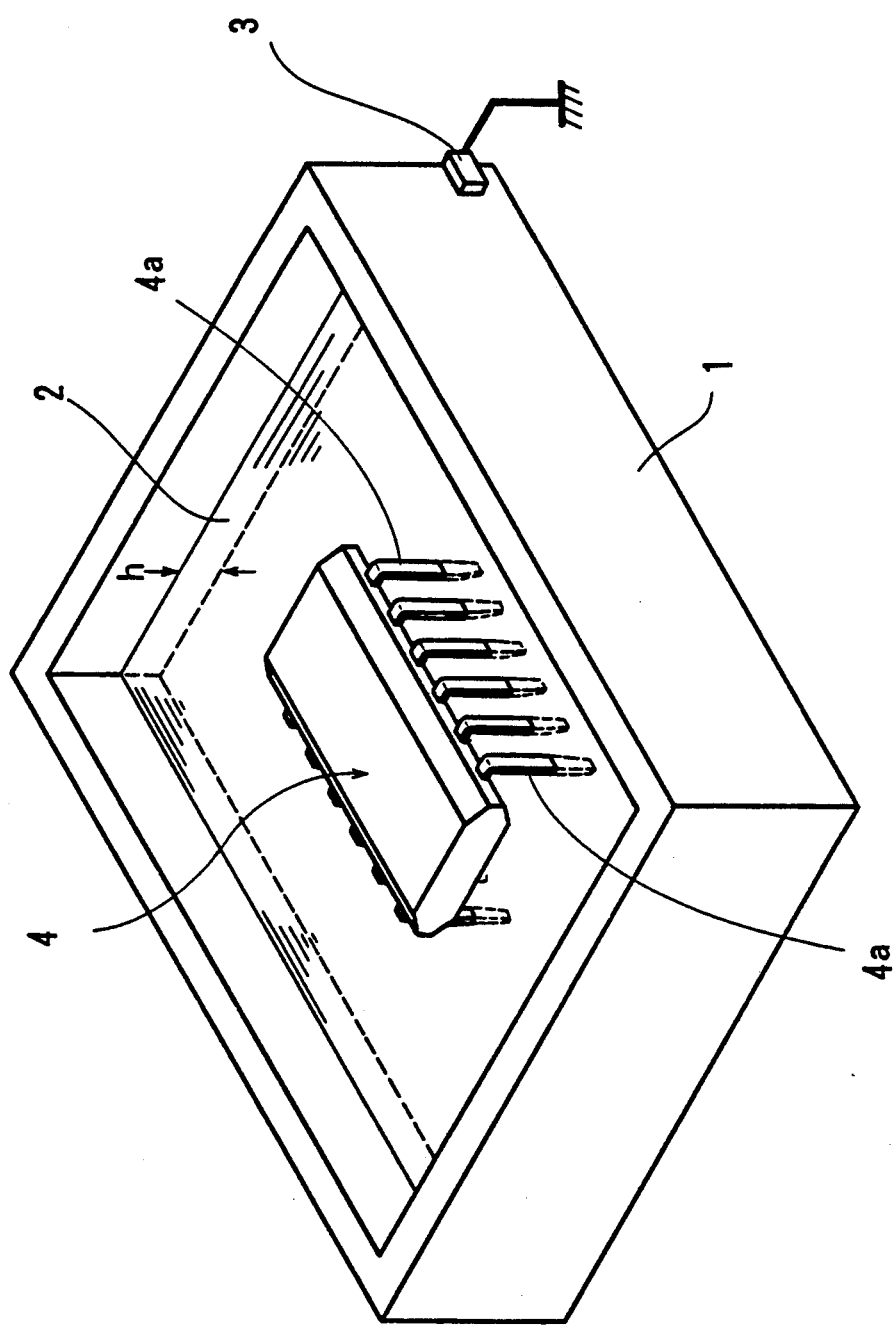
FIG. 1 is a perspective view showing a state wherein a semiconductor device is stored in a semiconductor device storage jig according to the first embodiment of the present invention.

An embodiment according to the present invention will be described with reference to the accompanying drawings.

Components designated by the same reference numerals have the same functions, and a repetitive description thereof will not be made.

As shown in FIG. 1, a conductive member 2 of a metal such as gallium is placed in a rectangular parallelepiped vessel 1 made of aluminum to a depth h, and a DIP (Dual-Inline Package) 4 is placed therein. External terminals 4a of the DIP 4 are kept inserted into the conductive member 2. A ground terminal 3 for grounding the external terminals 4a is formed on the outer side surface of the vessel 1.

The melting point of gallium is 29.78° C., and the melting point of aluminum is 660° C. When this vessel 1 is placed at a temperature of, e.g., 40° C., aluminum of the vessel 1 is kept in a solid phase, but gallium of the conductive member 2 is transformed into a liquid phase. The external terminals 4a of the DIP 4 are dipped in the molten gallium, so that all the external terminals 4a are kept in contact with the molten conductive member 2. In this case, since the conductive member 2 is grounded through the vessel 1 and the external terminals 3, all the external terminals 4a of the DIP 4 are grounded. In this state, even if a high voltage such as a high electrostatic voltage is applied to any one of the external terminals 4a of the DIP 4, all the external terminals are grounded, and an integrated circuit and the like inside the DIP 4 are not damaged.

A high-temperature test using the semiconductor device storage jig of this embodiment will be described below.

Figure 2:
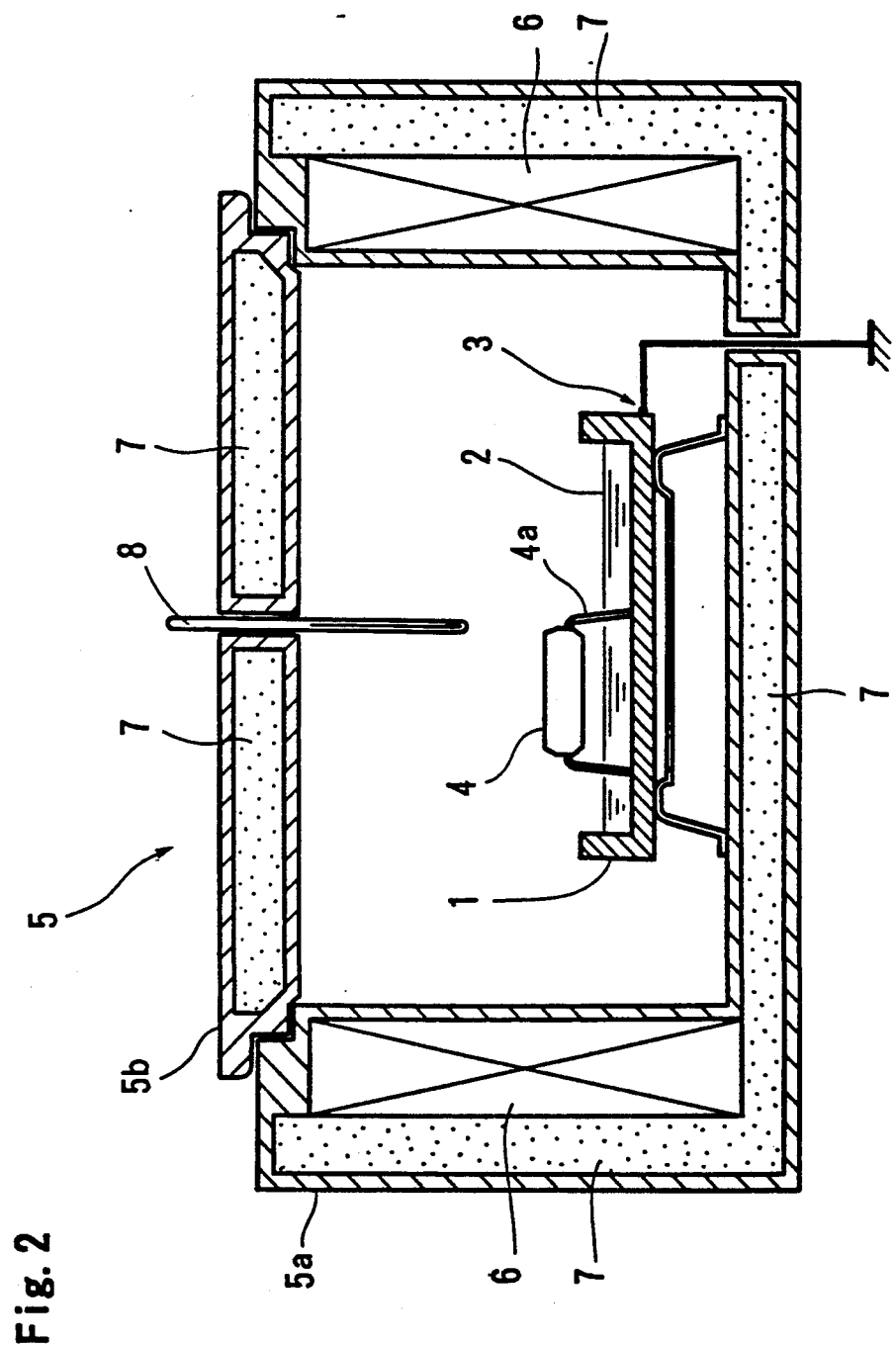
FIG. 2 is a longitudinal sectional view showing a state wherein the storage jig according to the first embodiment is stored in a high-temperature test unit.

FIG. 2 shows a state wherein the jig of this embodiment is placed in a high-temperature test unit 5. This high-temperature test unit comprises a casing 5a and a lid 5b. A heater 6 is incorporated in the side wall of the casing 5a. A heat-insulating material 7 is filled outside the heater 6 and in the bottom portion of the casing 5a. A temperature measuring element 8 such as a thermocouple is arranged at the central portion of the lid 5b. The heat-insulating material 7 is filled around the temperature measuring element 8. The semiconductor device storage jig according to this embodiment is placed in the casing 5a. A high-temperature of about 350° C. is maintained in the high-temperature test unit 5. In this case, a melting point a of the material of the vessel 1 of the jig, an ambient temperature b, and a melting point c of the conductive member 2 must satisfy the following condition:

$$a > b > c$$

As a combination of materials satisfying the above condition, aluminum, iron, copper or the like is used as a material of the vessel 1, and potassium, gallium, cesium or the like is used as the conductive member 2.

The ground terminal 3 for grounding the conductive member 2 is grounded outside the vessel 1.

The present invention is not limited to the particular embodiment described above. Various changes and modifications may be made within the spirit and scope of the invention.

In the above embodiment, the vessel has a rectangular parallelepiped shape. However, the shape of the vessel is not limited to a specific shape if it can contain a conductive member therein.

A recess may be formed in the inner bottom surface of the vessel to receive and hold the external terminals of the DIP 4 to prevent movement of the DIP 4.

Figure 3:
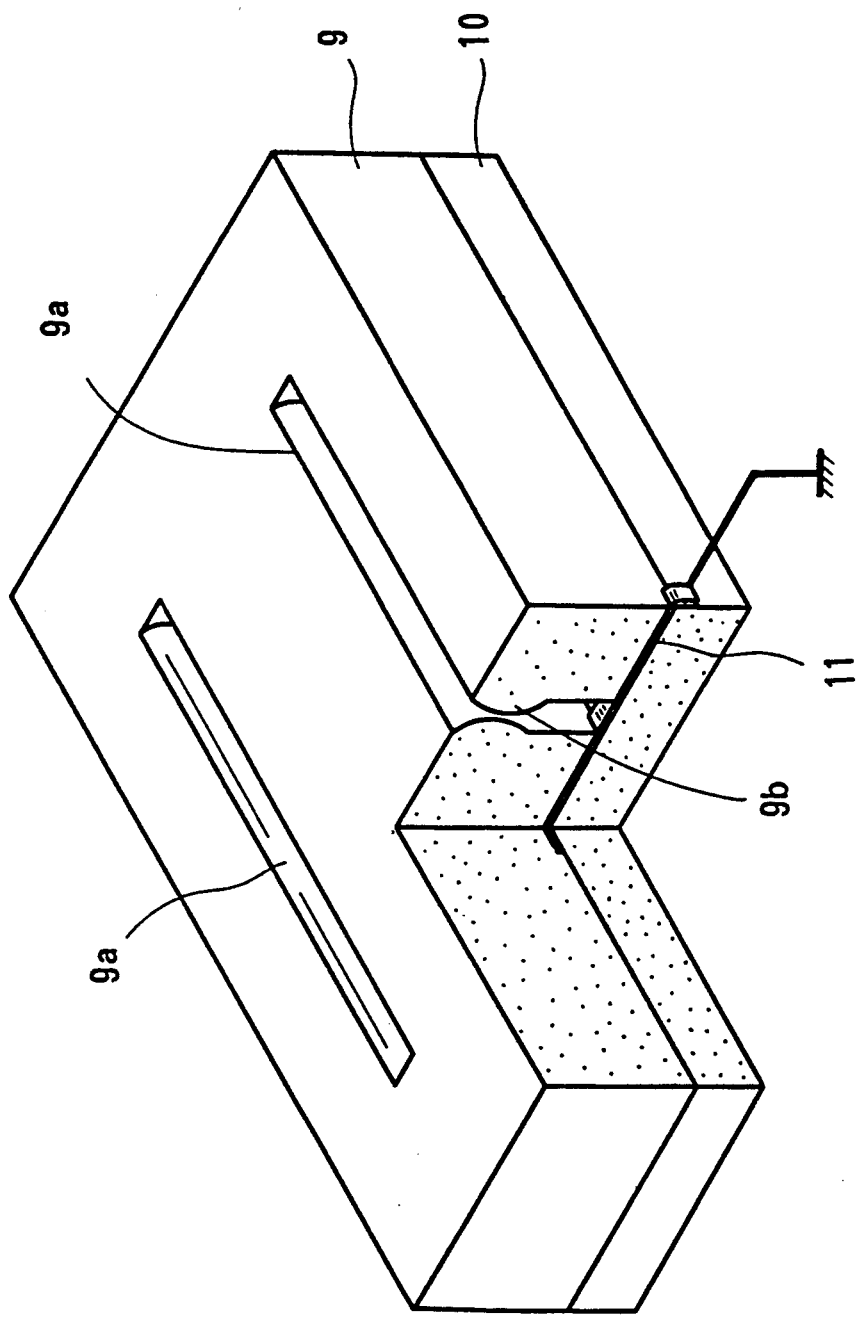
FIG. 3 is a partial cutaway perspective view showing an outer appearance of a semiconductor device storage jig according to the second embodiment of the present invention.

FIG. 3 shows a semiconductor device storage jig according to the second embodiment of the present invention. This storage jig is constituted by integrally forming two insulating plates made of a ceramic material or the like. Two parallel rectangular holes 9a are formed in an upper plate 9. A clamping portion 9b is formed in each hole 9a to clamp external elements 4a of a DIP 4. A metal wiring 11 is formed between the upper plate 9 and a lower plate 10. This metal wiring 11 is located in the bottoms of the two holes 9a and is grounded outside the storage jig. Since the upper ceramic plate 9 and the lower ceramic plate 10 are hermetically bonded to each other, a conductive member 2 does not leak along the metal wiring 11 even if the conductive member 2 is melted.

Figure 4:
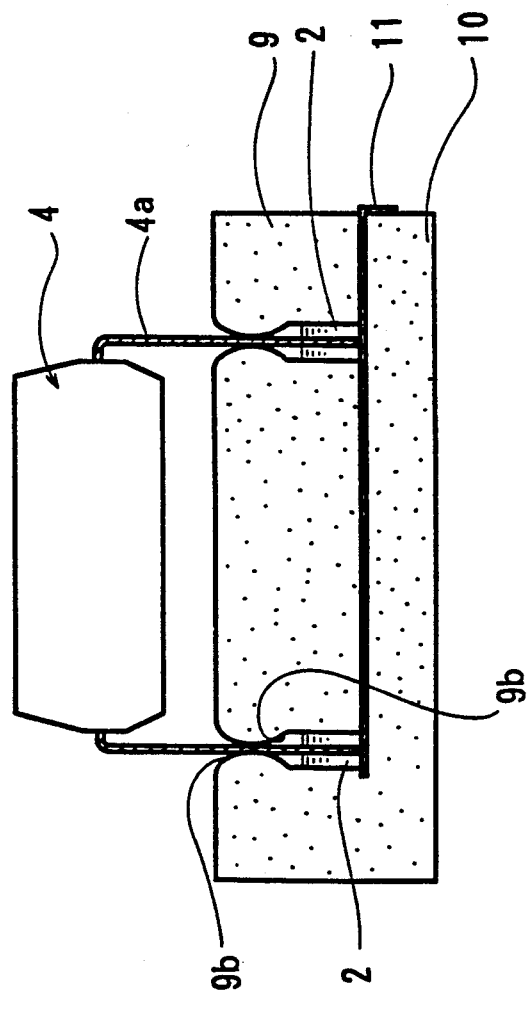
FIG. 4 is a longitudinal sectional view along a plane including a pair of external terminals in a state wherein a semiconductor device is stored in the storage jig according to the second embodiment of the present invention.

FIG. 4 shows a state wherein the DIP 4 is inserted into the upper ceramic plate 9 of the storage jig. The external electrodes 4a of the DIP 4 are clamped between the clamping portions 9b. The metal wiring 11 is connected at the bottoms of the holes 9a, and the molten conductive member 2 is stored in the holes 9a. Therefore, the external terminals 4a of the DIP 4 are grounded through the molten conductive member 2.

Figure 5:
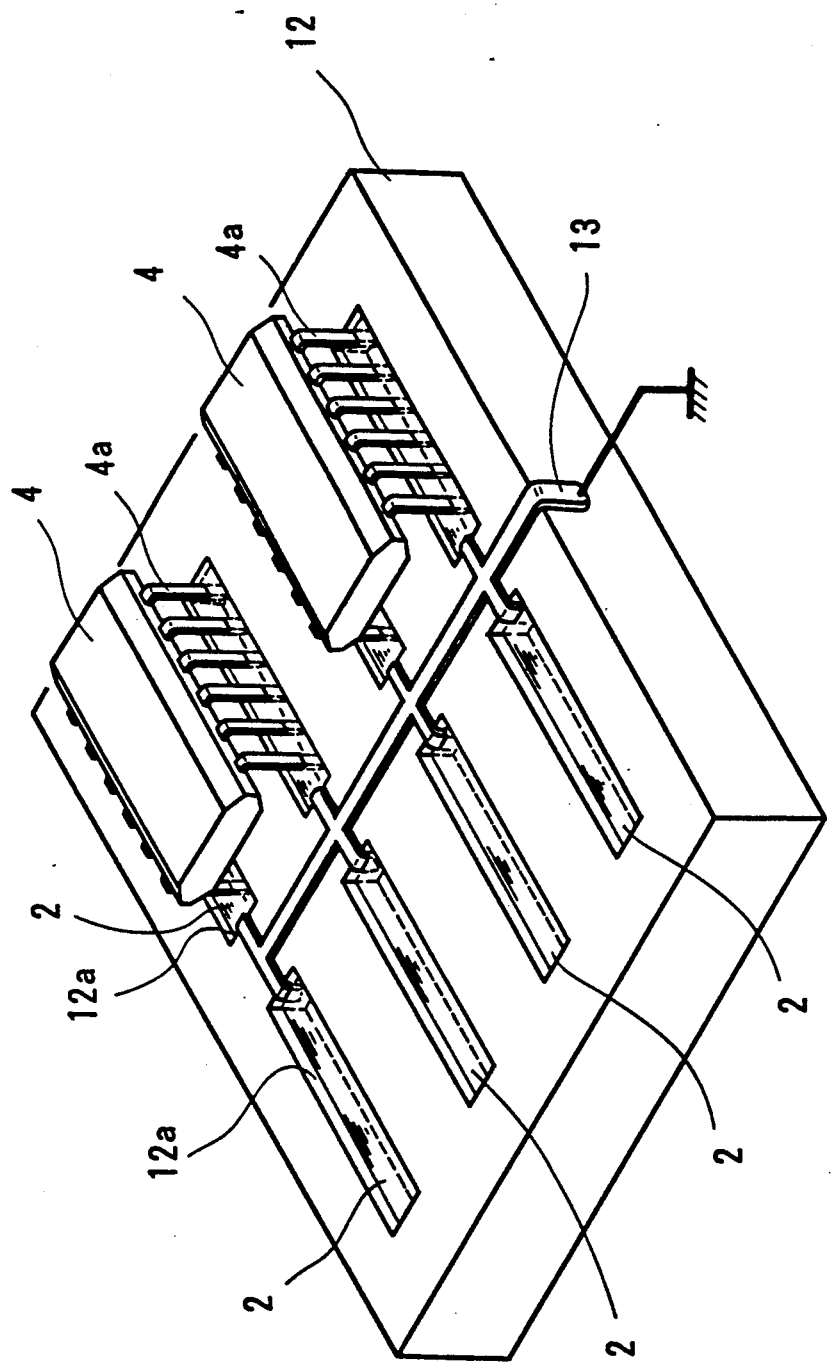
FIG. 5 is a perspective view showing an outer appearance of a semiconductor device of the third embodiment of the present invention in a state wherein two semiconductor devices are stored.

A recess may be formed to receive a plurality of DIPs. FIG. 5 shows a semiconductor device storage jig according to the third embodiment of the present invention. This storage jig is constituted by a ceramic plate 12. Eight rectangular holes 12a are formed in the upper surface of the ceramic plate 12. A liquid conductive member 2 is filled in each hole 12a. A metal wiring 13 is dipped in the conductive member 2 in these holes 12a. The end portion of the metal wiring 13 is grounded. In this embodiment, two DIPs 4 are inserted into the four holes 12a, and all the external terminals 4a are properly grounded.

In the above embodiment, the DIP is used as a semiconductor device. However, the present invention is not limited to this type of semiconductor device. For example, the present invention is also applicable to an IC or LSI of a different type. In addition, the combination of the materials of the vessel and the conductive member is not limited to the specific one described above. Any combination may be selected if the above condition is satisfied.

In a semiconductor device storage jig according to the present invention, as described above, potentials of external terminals of a semiconductor device stored in the vessel can be kept equal to each other. In addition, storage and a test in a high-temperature environment can be performed by properly selecting the material of the vessel.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A jig for storing at a predetermined temperature a semiconductor device having external terminals, said jig comprising:
   a vessel having a melting point higher than said predetermined temperature and having at least one recess which receives said external terminals;
   a conductive material in a liquid state filling a portion of each recess, said conductive material having a melting point lower than said melting point of said vessel; and
   a conductive terminal connected to said conductive material.

2. A jig according to claim 1, wherein said vessel is made of an insulating material, and said conductive terminal is connected to ground.

3. A jig according to claim 2, wherein said conductive material has a melting point lower than said 4. A jig according to claim 2, wherein said vessel has a plurality of recesses, each recess receiving a conductive terminal, and each conductive terminal being independent of one another.

5. A jig according to claim 2, wherein said vessel has at least a pair of recesses, and each recess in said pair of recesses linearly receiving said external terminals.

6. A jig according to claim 5, wherein said conductive terminal is made of a common metal wiring and is arranged at a bottom portion of each recess.

7. A jig according to claim 5, wherein said conductive terminal comprises a common metal wiring connected to said conductive material.

8. A jig according to claim 2, further comprising a holding portion, formed at an inlet of each recesses, for holding said external terminals.

9. A jig according to claim 2, wherein said conductive terminal is located at a bottom of each recess.

10. A jig for storing at a predetermined temperature a semiconductor device having external terminals, said jig comprising:
   a vessel having a melting point higher than said predetermined temperature and having at least one recess which receives said external terminals, said vessel being electrically conductive and connected to ground; and
   a conductive material in a liquid state filling a portion of each recess, said conductive material having a melting point lower than said melting point of said vessel.

11. A jig for storing at a predetermined temperature a semiconductor device having external terminals, said jig comprising:
   a vessel having a melting point higher than said predetermined temperature and having at least one recess which receives said external terminals, said vessel being made of an insulating material and having a holding portion, formed at an inlet of each recess, for holding said external terminals;
   a conductive material filling each recess to a level lower than said holding portion, said conductive material having a melting point lower than said melting point of said vessel; and
   a conductive terminal connected to said conductive material and ground.

12. A jig according to claim 11, wherein said conductive material is in a liquid state.

13. A jig according to claim 12, wherein said vessel has at least one pair of recesses and each recess linearly receives said external terminals.

14. A jig according to claim 11, wherein said vessel has at least one pair of recesses and each recess linearly receives said external terminals.

15. A jig for storing at a predetermined temperature a semiconductor device having external terminals, said jig comprising:
   a vessel having a melting point higher than said predetermined temperature and having at least one recess which receives said external terminals;
   a conductive material filling a portion of each recess, said conductive material having a melting point lower than said predetermined temperature and a vaporization point higher than said predetermined temperature; and
   a conductive terminal connected to said conductive material.

* * * * *